United States Patent
Briere (10) Patent No.: US 9,105,566 B2
(45) Date of Patent: Aug. 11, 2015

(54) MONOLITHIC INTEGRATED COMPOSITE GROUP III-V AND GROUP IV DEVICE

(71) Applicant: International Rectifier Corporation, El Segundo, CA (US)

(72) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 142 days.

(21) Appl. No.: 13/968,840

(22) Filed: Aug. 16, 2013

(65) Prior Publication Data
US 2013/0334574 A1    Dec. 19, 2013

Related U.S. Application Data

(62) Division of application No. 12/653,236, filed on Dec. 10, 2009, now Pat. No. 8,530,938.

(51) Int. Cl.
| | |
|---|---|
| H01L 21/02 | (2006.01) |
| H01L 29/205 | (2006.01) |
| H01L 21/8252 | (2006.01) |
| H01L 27/06 | (2006.01) |
| H01L 29/267 | (2006.01) |
| H01L 21/761 | (2006.01) |

(52) U.S. Cl.
CPC ............ *H01L 29/205* (2013.01); *H01L 21/761* (2013.01); *H01L 21/8252* (2013.01); *H01L 27/0605* (2013.01); *H01L 29/267* (2013.01)

(58) Field of Classification Search
CPC .......................... H01L 21/8252; H01L 29/205
USPC ............................................ 257/22, 200, 301
See application file for complete search history.

(56) References Cited

U.S. PATENT DOCUMENTS

| 5,064,781 | A | 11/1991 | Cambou | |
|---|---|---|---|---|
| 2003/0022395 | A1* | 1/2003 | Olds | 438/3 |
| 2003/0139012 | A1 | 7/2003 | Yamauchi | |
| 2007/0048975 | A1* | 3/2007 | Chen et al. | 438/478 |
| 2007/0105256 | A1* | 5/2007 | Fitzgerald | 438/34 |

FOREIGN PATENT DOCUMENTS

| EP | 0 905 760 | 3/1999 |
|---|---|---|
| EP | 1 089 338 | 4/2001 |

* cited by examiner

*Primary Examiner* — Mark Tornow
(74) *Attorney, Agent, or Firm* — Farjami & Farjami LLP (57) ABSTRACT

According to one disclosed embodiment, a method for fabricating a monolithic integrated composite device comprises forming a group III-V semiconductor body over a group IV semiconductor substrate, forming a trench in the group III-V semiconductor body, and forming a group IV semiconductor body in the trench. The method also comprises fabricating at least one group IV semiconductor device in the group IV semiconductor body, and fabricating at least one group III-V semiconductor device in the group III-V semiconductor body. In one embodiment, the method further comprises planarizing an upper surface of the III-V semiconductor body and an upper surface of the group IV semiconductor body to render those respective upper surfaces substantially co-planar. In one embodiment, the method further comprises fabricating at least one passive device in a defective region of said group IV semiconductor body adjacent to a sidewall of the trench.

14 Claims, 6 Drawing Sheets

MONOLITHIC INTEGRATED COMPOSITE GROUP III-V AND GROUP IV DEVICE

This is a divisional of application Ser. No. 12/653,236 filed Dec. 10, 2009.

BACKGROUND OF THE INVENTION

Definition

In the present application, "group III-V semiconductor" refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

1. Field of the Invention

The present invention is generally in the field of semiconductors. More specifically, the present invention is in the field of fabrication of compound semiconductor devices.

2. Background Art

Increased diversity in the types of materials used for semiconductor device fabrication have made integration of conventional silicon devices with more recent generations of non-silicon high voltage devices challenging. For example, although it may be highly desirable to use a silicon or other conventional group IV semiconductor device to control a III-nitride transistor, a conventional approach to doing so typically requires that the two distinct device types, each fabricated using different active semiconductor materials on different dies, be co-packaged, rather than share a single common die.

Unfortunately, this conventional approach to implementing group IV semiconductor devices in combination with non-group IV devices entails several significant drawbacks. For example, because the separate devices are typically fabricated separately on separate dies, their combination requires more space and is more expensive than if the devices were to be integrated on a single die. In addition, the requirement that the separate dies be electrically coupled in packaging, typically by wire bonding the dies together, introduces reliability and performance constraints flowing from the physical durability of the bonds, as well as parasitic inductances introduced by the wires themselves that may effectively decouple the separate devices at high switching speeds. Moreover, because the individual devices are fabricated separately on separate dies, particular pairs or groups of individual devices combined for co-packaging may be less than ideally matched, resulting in sub-optimal performance of the composite device.

Thus, there is a need to overcome the drawbacks and deficiencies in the art by providing a solution enabling effective and efficient integration of a group III-V semiconductor device with a group IV semiconductor device on a single die, i.e., their monolithic integration.

SUMMARY OF THE INVENTION

A monolithic integrated composite group III-V and group IV semiconductor device and method for fabricating same, substantially as shown in and/or described in connection with at least one of the figures, as set forth more completely in the claims.

DETAILED DESCRIPTION OF THE INVENTION

The present invention is directed to a monolithic integrated composite group III-V and group IV semiconductor device and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

Figure 1:
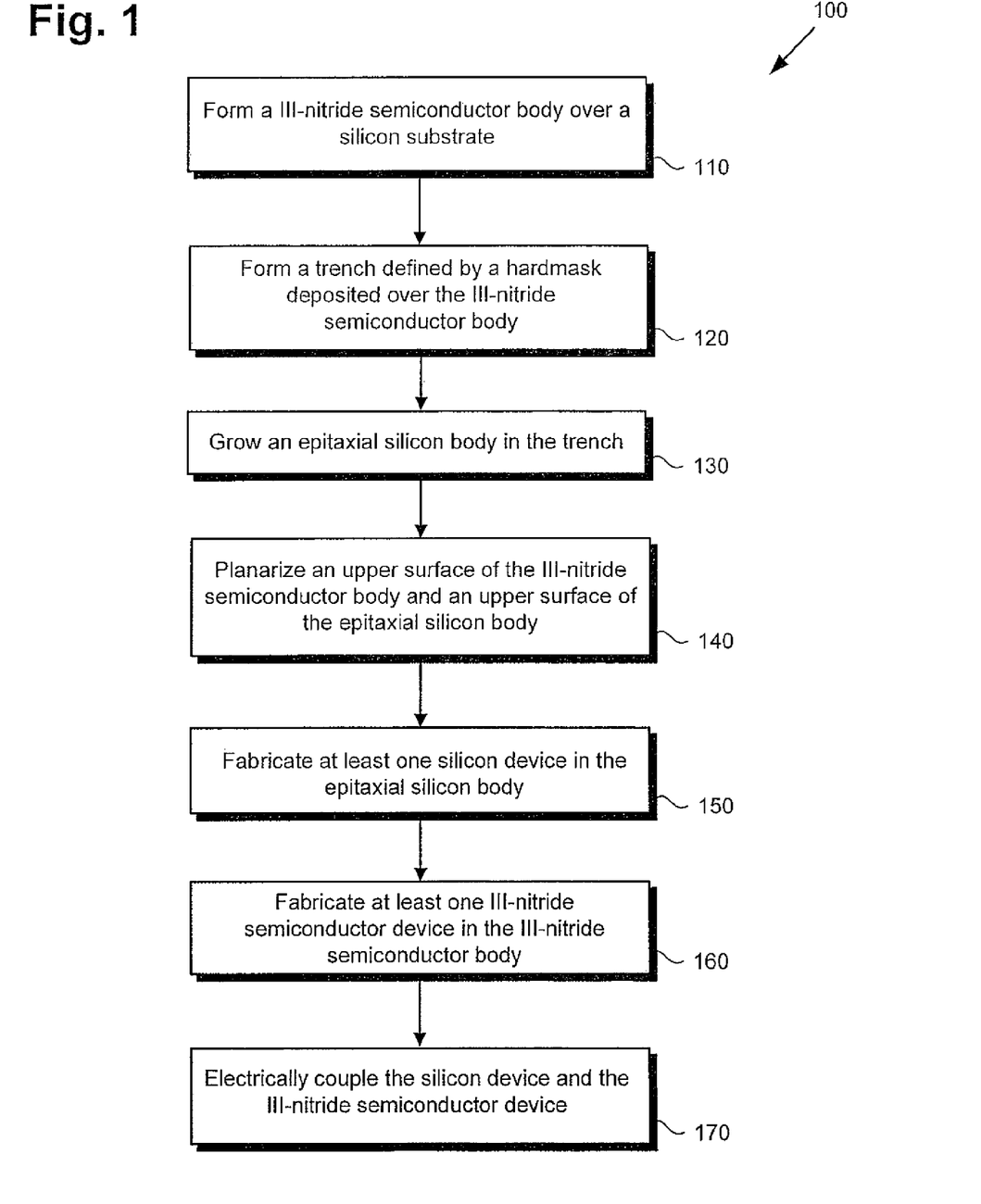
FIG. 1 is a flowchart presenting a method for fabricating a monolithic integrated composite group III-V and group IV semiconductor device, according to one embodiment of the present invention.

FIG. 1 shows a flowchart illustrating an exemplary method, according to one embodiment of the present invention, for fabricating a monolithic integrated composite group and group IV semiconductor device. Certain details and features have been left out of flowchart 100 that are apparent to a person of ordinary skill in the art. For example, a step may comprise one or more substeps or may involve specialized equipment or materials, as known in the art. While steps 110 through 170 indicated in flowchart 100 are sufficient to describe one embodiment of the present invention, other embodiments of the invention may utilize steps different from those shown in flowchart 100.

Figure 2A:
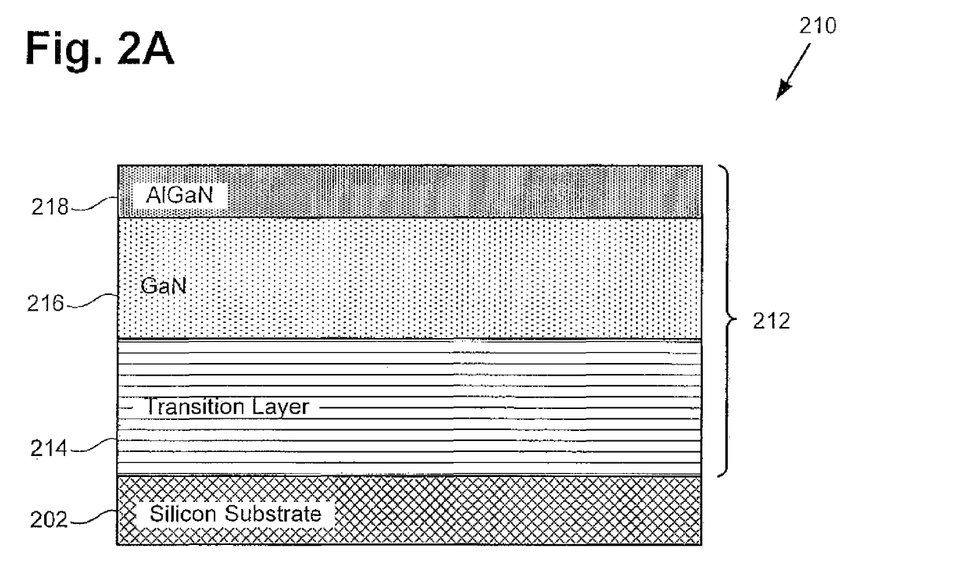
FIG. 2A shows a cross-sectional view of a structure representing a monolithic integrated composite group III-V and group IV semiconductor device at an initial fabrication stage, according to one embodiment of the present invention.

Turning now to FIG. 2A, composite structure 210 of FIG. 2A shows a cross-sectional view representing a monolithic integrated composite group and group IV semiconductor device at an initial fabrication stage, according to one embodiment of the present invention. Composite structure 210 shows III-nitride semiconductor body 212 formed over silicon substrate 202. As shown by FIG. 2A, according to the present embodiment, III-nitride semiconductor body 212 includes transition layer 214, gallium nitride (GaN) layer 216, and aluminum gallium nitride (AlGaN) layer 218. In particular, FIG. 2A shows composite structure 210 at a stage of fabrication following processing step 110 of flowchart 100.

Referring to FIGS. 2B, 2C, 2D, and 2E, structures 220, 230, 240, and 270 show the result of performing, on composite structure 210, steps 120, 130, 140, and 170 of flowchart 100 of FIG. 1, respectively. For example, composite structure 220 shows composite structure 210 following processing step 120, composite structure 230 shows composite structure 210 following processing step 130, and so forth.

Due to the relatively low ablation temperature of many group semiconductors, it is contemplated that the exemplary method of flowchart 100 be performed in an environmental temperature of less than approximately 850° C., in order to prevent decomposition of the group semiconductor materials, e.g., GaN and AlGaN, used to fabricate portions of the composite device. However, it is noted that the structures shown in FIGS. 2A through 2E are provided as specific implementations of the present inventive principles, and are shown with such specificity for the purposes of conceptual clarity. It should also be understood that particular details such as the materials used to form structures 210 through 270, the semiconductor devices represented by those fabrication stages, and the techniques used to produce the various depicted features, are being provided as examples, and should not be interpreted as limitations.

For example, although the embodiments shown in FIGS. 2A through 2F represent fabrication of high electron mobility transistors (HEMTs) in GaN, typically the primary constraints placed upon the constituents of III-nitride semiconductor body 212 are that layer 218 comprise a group III-V semiconductor having a wider band gap than the group III-V semiconductor forming layer 216, and that both group III-V semiconductors be selected so as to produce a two-dimensional electron gas (2 DEG) at their heterojunction interface (2 DEG not shown in FIG. 2A.). In addition, the primary constraint placed on transition layer 214 is that it provide a suitable environment for growth of group III-V semiconductor layer 216. Although the embodiment shown by FIGS. 2A through 2E depict fabrication of HEMTs in GaN, other embodiments of the present invention may comprise N-channel or P-channel field-effect devices, formed using GaN or any other suitable group III-V semiconductor materials, as described in the "Definition" section above. In addition, it is noted that FIGS. 2A through 2E are not drawn to scale, so that some of the features shown may be depicted as either larger or smaller relative to other features than would typically be the case in practice.

Beginning with step 110 in FIG. 1 and composite structure 210 in FIG. 2A, step 110 of flowchart 100 comprises forming III-nitride semiconductor body 212 over silicon substrate 202. Silicon substrate 202 is shown as a unitary group IV semiconductor substrate, but in other embodiments, silicon substrate 202 may correspond to any suitable substrate for formation of a monolithic composite group III-V and group IV semiconductor device. For example, in some embodiments, silicon substrate 202 may correspond to a semiconductor on insulator substrate such, as a silicon on insulator (SOI) or germanium on insulator (GOI) substrate, for example.

As shown in FIG. 2A, in one embodiment, III-nitride semiconductor body 212 may comprise a plurality of III-nitride layers, which may include transition layer 214, GaN layer 216, and AlGaN layer 218. Transition layer 214 may itself correspond to a plurality of distinguishable layers mediating the lattice transition from silicon substrate 202 to GaN layer 216. For example, transition layer 214 may include an aluminum nitride (AlN) layer formed on silicon substrate 202, and a series of AlGaN layers comprising progressively less aluminum and more gallium, until a suitable transition to GaN layer 216 is achieved.

III-nitride semiconductor body 212 may be formed over silicon substrate 202 using any of a number of conventional growth techniques. For example, GaN layer 216 may be formed over transition layer 214 using molecular-beam epitaxy (MBE), metalorganic chemical vapor deposition (MOCVD), or hydride vapor phase epitaxy (HVPE), to name a few suitable approaches. Similarly, AlGaN layer 218 may be formed over GaN layer 216 using any of MBE, MOCVD, or HVPE, for example. The active region of III-nitride semiconductor body 212 is represented in FIG. 2A by GaN layer 216 and AlGaN layer 218, which are typically not doped, and meet to form a heterojunction interface giving rise to the 2 DEG previously mentioned. As also noted previously, FIG. 2A is not drawn to scale. For instance, although GaN layer 216 and AlGaN layer 218 typically have distinctly different respective thicknesses, such as thicknesses of approximately 1500 A for GaN layer 216 and of approximately 150 A for AlGaN layer 218, for example, in FIG. 2A those layers are shown as having more closely comparable thicknesses.

Figure 2B:
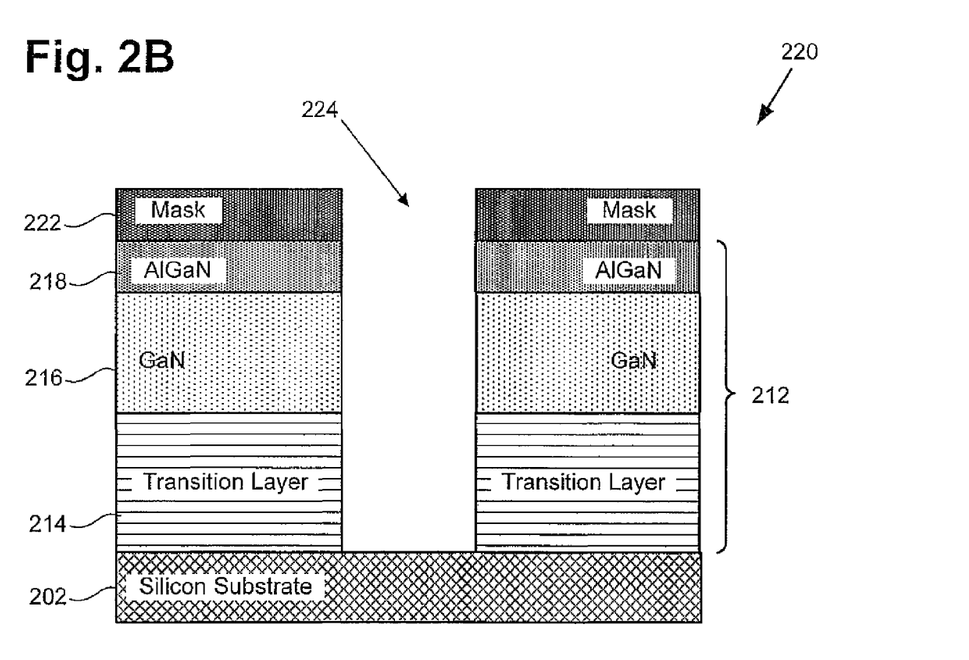
FIG. 2B shows a cross-sectional view of a structure representing a monolithic integrated composite group III-V and group IV semiconductor device at an intermediate fabrication stage, according to one embodiment of the present invention.

Continuing on to step 120 in FIG. 1 and composite structure 220 in FIG. 2B, step 120 of flowchart 100 comprises forming trench 224 defined by hardmask 222 deposited over III-nitride semiconductor body 212. Hardmask 222 may comprise silicon dioxide ($SiO_2$) or silicon nitride ($Si_3N_4$), for example, and may be deposited over AlGaN layer 218 using a plasma enhanced chemical vapor deposition (PECVD) process. Hardmask 222 may be further processed to define an opening for trench 224. Trench 224 may then be formed in III-nitride body 212, for example, by etching through AlGaN layer 218, GaN layer 216, and transition layer 214 to silicon substrate 202.

Figure 2C:
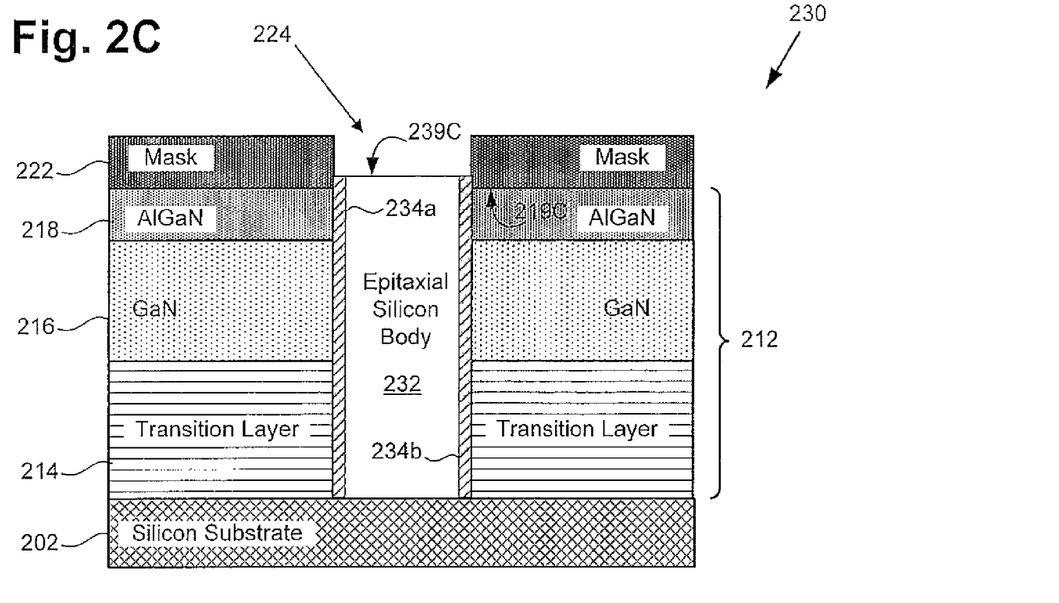
FIG. 2C shows a cross-sectional view of a structure representing a monolithic integrated composite group III-V and group IV semiconductor device at an intermediate fabrication stage, according to one embodiment of the present invention.

Referring to step 130 of FIG. 1 and composite structure 230 in FIG. 2C, step 130 of flowchart 100 comprises growing epitaxial silicon body 232 in trench 224. Formation of epitaxial silicon body 232 may be performed by any suitable method, as known in the art, such as chemical vapor deposition (CVD) or MBE, for example. More generally, however, formation of epitaxial silicon body 232 in step 130 of flowchart 100 corresponds to formation of any suitable group IV semiconductor body in trench 224. Thus, in other embodiments, group IV semiconductor body 232 need not be silicon, and/or need not be formed through epitaxial growth. For example, in one embodiment, group IV semiconductor body 232 may comprise either a strained or unstrained germanium layer formed in trench 224. Alternatively, group IV semiconductor body 232 may comprise a composite group IV semiconductor such as silicon-germanium, for example.

As shown in FIG. 2C, a typical growth process in step 130 will result in epitaxial silicon body 232 having first and second defective regions 234a and 234b adjacent to respective first and second sidewalls of trench 224. In addition, growth of epitaxial silicon in trench 224 is likely to produce epitaxial silicon body 232 such that upper surface 239C of epitaxial silicon body 232 and upper surface 219C of III-nitride semiconductor body 212 are not coplanar, e.g., upper surface 239C of epitaxial silicon body 232 may extend beyond upper surface 219C of III-nitride semiconductor body 212, as shown in FIG. 2C.

Figure 2D:
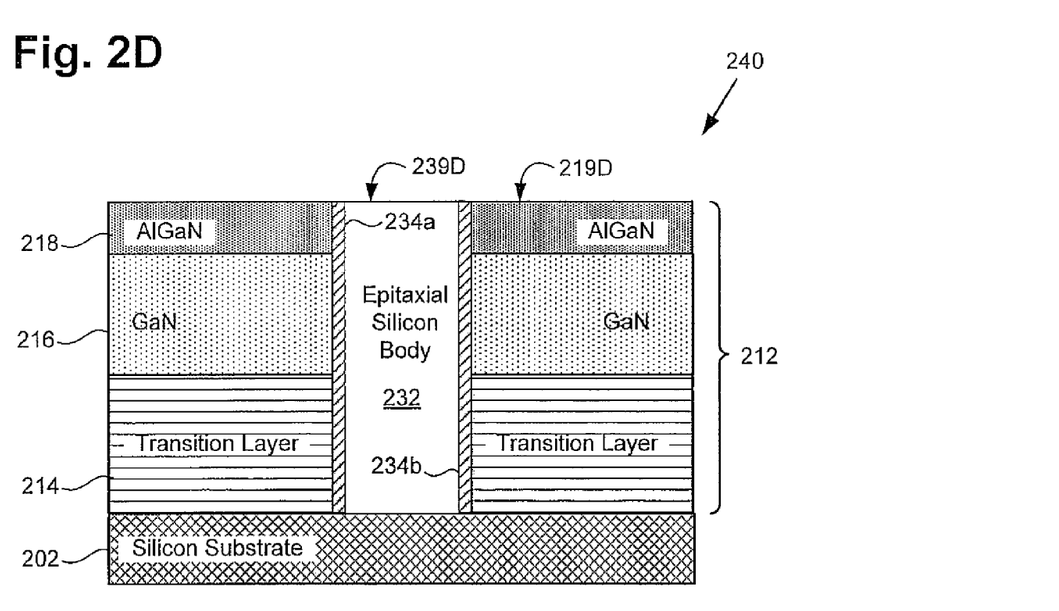
FIG. 2D shows a cross-sectional view of a structure representing a monolithic integrated composite group III-V and group IV semiconductor device at an intermediate fabrication stage, according to one embodiment of the present invention.

Continuing with step 140 of flowchart 100, step 140 comprises planarizing upper surface 219C of III-nitride semiconductor body 212 and upper surface 239C of epitaxial silicon body 232. Step 140 may be performed using a chemical-mechanical polishing (CMP) technique, for example. As a result, as shown in FIG. 2D, hardmask 222 is removed, while upper surface 219D of III-nitride semiconductor body 212 and upper surface 239D of epitaxial silicon body 232 are rendered substantially coplanar.

Planarizing III-nitride semiconductor body 212 and epitaxial silicon body 232 may provide several advantages. For example, during a lithographic imaging process, having upper surfaces 219D and 239D substantially coplanar may reduce the focusing and imaging steps required for exposure of composite structure 240. In addition, subsequent formation of electrical connections for coupling III-nitride semiconductor devices fabricated in III-nitride semiconductor body 212 with silicon devices fabricated in epitaxial silicon body 232 may be facilitated if upper surfaces 219D and 239D are substantially coplanar.

Figure 2E:
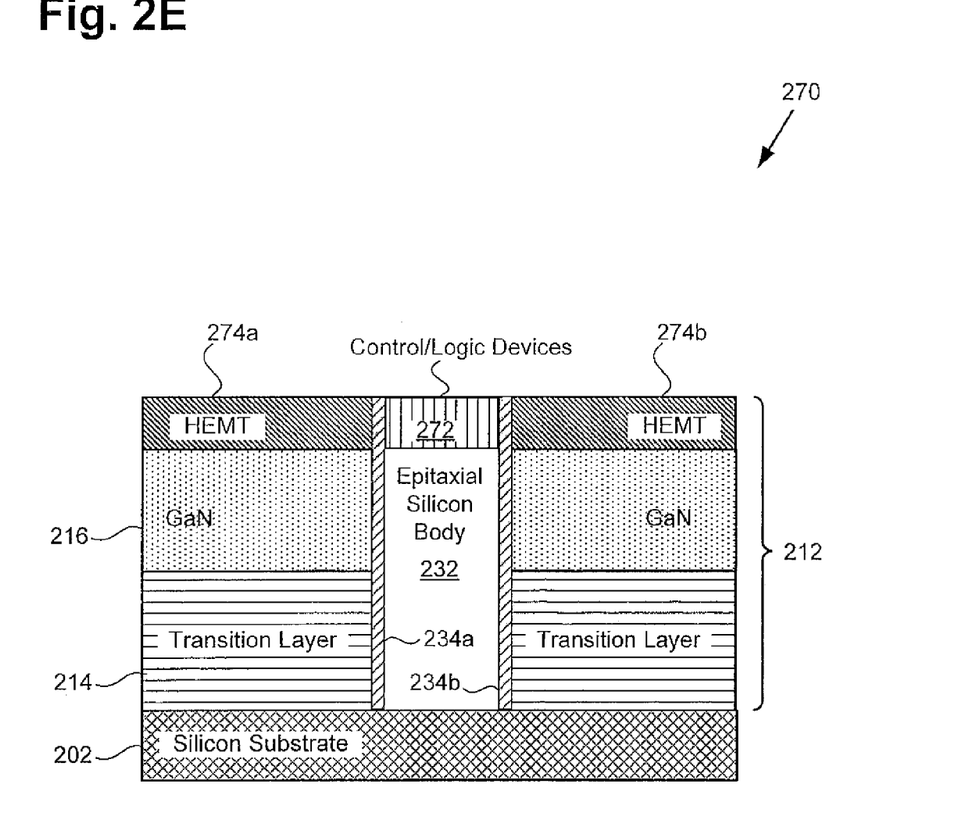
FIG. 2E shows a cross-sectional view of a structure representing a monolithic integrated composite group III-V and group IV semiconductor device at a final fabrication stage, according to one embodiment of the present invention.

Moving on to step 150 of flowchart 100 and composite structure 270 in FIG. 2E, step 150 of flowchart 100 comprises fabricating one or more silicon devices 272 in epitaxial silicon body 232. According to the embodiment of FIG. 2E, step 150 corresponds to formation of silicon control and/or logic devices for composite structure 270.

Proceeding to step 160 of flowchart 100 and continuing to refer to FIG. 2E, step 160 of flowchart 100 comprises fabricating one or more of III-nitride HEMTs 274*a* and 274*b* in III-nitride semiconductor body 212. Fabrication of one or more of III-nitride HEMTs 274*a* and 274*b*, in step 160, may include formation of a field insulation or passivation layer, performance of a GaN isolation process, opening active and contact regions for III-nitride HEMTs 274*a* and 274*b*, and so forth, as known in the art.

Following step 160, electrical interconnects for coupling the one or more silicon devices 272 and at least one of III-nitride HEMTs 274*a* and 274*b* are formed in step 170. For example, one or more metallization layers included in composite structure 270 (not shown in FIG. 2E) may be used to electrically couple one or more of III-nitride HEMTs 274*a* and 274*b* to silicon control/logic device(s) 272. More generally, composite structure 270 may be seen to correspond to a monolithic integrated composite of one or more group III-V power semiconductor devices, e.g., III-nitride HEMT 274*a*, electrically coupled to one or more group IV semiconductor devices, e.g., silicon device(s) 272, wherein both device types share silicon substrate 202 in common. In the embodiment shown in FIG. 2E, for example, step 170 enables silicon control/logic device(s) 272 to control the operation of III-nitride power semiconductor HEMTs 274*a* and/or 274*b*.

In other embodiments of the present invention, the method of flowchart 100 may comprise additional steps resulting in fabrication of composite structures other than those shown in FIGS. 2A through 2E. For example, FIG. 3 shows a cross-sectional representation of a monolithic integrated composite group III-V and group IV semiconductor device including buried N type and buried P type layers, according to one embodiment of the present invention.

Figure 3:
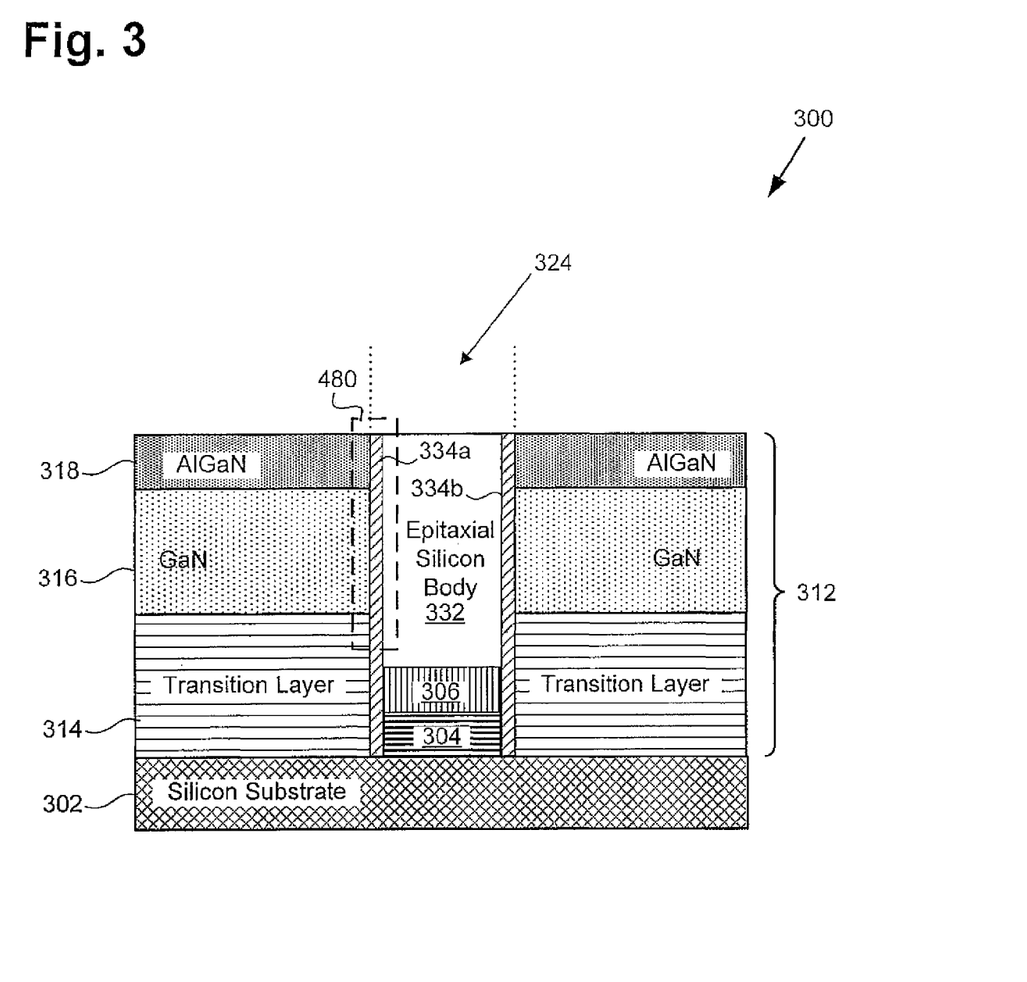
FIG. 3 shows a cross-sectional representation of a monolithic integrated composite group III-V and group IV semiconductor device including buried N type and buried P type layers, according to one embodiment of the present invention.

Composite structure 300, in FIG. 3, comprises silicon substrate 302 supporting overlying III-nitride semiconductor body 312, corresponding to silicon substrate 202 supporting overlying III-nitride semiconductor body 212, in FIGS. 2A through 2F. As shown in FIG. 3, III-nitride semiconductor body 312 may comprise a plurality of III-nitride layers including transition layer 314, GaN layer 316, and AlGaN layer 318, which correspond respectively to transition layer 214, GaN layer 216, and AlGaN layer 218 in the previous figures. Also shown in FIG. 3 is epitaxial silicon body 332 including defective regions 334*a* and 334*b*, formed in trench 324, corresponding respectively to epitaxial silicon body 232 including defective regions 234*a* and 234*b*, and formed in trench 224. In addition, composite structure 300 includes first buried layer 304 having a first conductivity type, and second buried layer 306 having a second conductivity type.

Composite structure 300, in FIG. 3, may be fabricated according to the method of flowchart 100, in FIG. 1, wherein the method of flowchart 100 further comprises steps of forming first buried layer 304 having a first conductivity type, e.g. N type conductivity, in trench 324 over silicon substrate 302, and forming second buried layer 306 having a second conductivity type, e.g. P type conductivity, between first buried layer 304 and III-nitride semiconductor body 312. Although not shown in FIG. 3, structure 300 may also include one or more silicon devices fabricated in epitaxial silicon body 332, and one or more III-nitride semiconductor device, such as HEMTs implemented in GaN, for example, fabricated in III-nitride semiconductor body 312.

First and second buried layers 304 and 306, which may be formed by selective in situ or implantation doping of portions of epitaxial silicon body 332 during growth, for example, may provide enhanced electrical isolation of the one or more silicon devices fabricated in epitaxial silicon body 332. As a result, formation of first and second buried layers 304 and 306, as shown in the embodiment of FIG. 3, may be performed so as to enable monolithic integration of group III-V and group IV power semiconductor devices in a single composite device.

Figure 4:
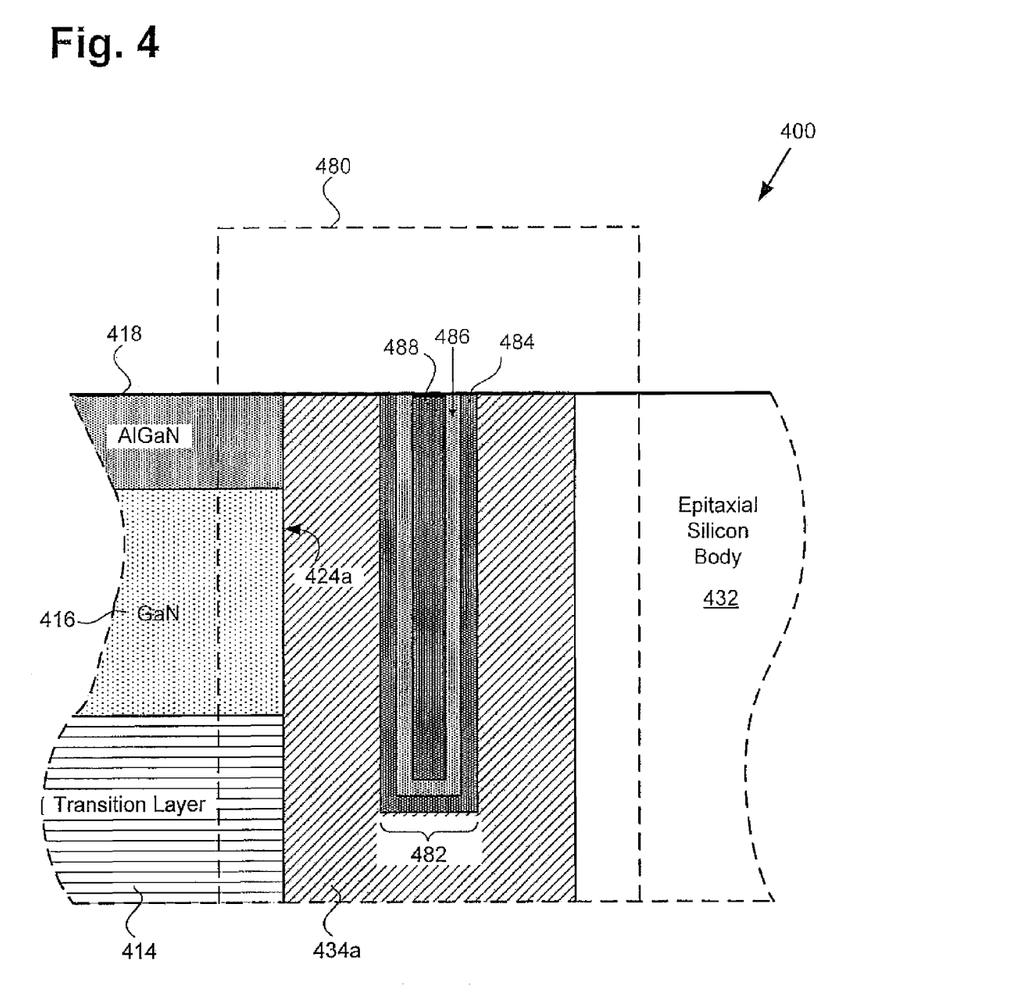
FIG. 4 shows a cross-sectional representation of a monolithic integrated composite group III-V and group IV semiconductor device including a passive device fabricated in a group IV defective region, according to one embodiment of the present invention.

Turning now to FIG. 4, FIG. 4 shows a cross-sectional representation of a monolithic integrated composite group III-V and group IV semiconductor device including a passive device fabricated in a group IV defective region, according to one embodiment of the present invention. Structure 400 shows an expanded view of region 480, in FIG. 3. In addition to region 480, structure 400 shows portions of transition layer 414, GaN layer 416, AlGaN layer 418, epitaxial silicon body 432, and defective region 434*a*, corresponding respectively to portions of transition layer 314, GaN layer 316, AlGaN layer 318, epitaxial silicon body 332, and defective region 334*a*, associated with region 480 in FIG. 3.

Also shown in FIG. 4 is a passive device, in this instance trench capacitor 482, fabricated in defective region 434*a*. Composite structure 400, represented in FIG. 4, may be fabricated according to the method of flowchart 100, in FIG. 1, wherein the method of flowchart 100 further comprises a step of fabricating at least one passive device, e.g., trench capacitor 482, in defective region 434*a* of epitaxial silicon body 432 adjacent to trench sidewall 424*a*.

Fabrication of a trench capacitor, such as trench capacitor 482, is known in the art. Without delving into extensive detail, it is noted that fabrication of trench capacitor 482 may include forming an outer capacitor plate 484 from a suitable conducting material, such as doped polysilicon, forming an insulating layer 486 of material such as $SiO_2$ or other suitable dielectric, and depositing a second conductive material, which may again comprise doped polysilicon, to form inner capacitor plate 488. Although the present embodiment shows fabrication of a trench capacitor in defective region 434a, in other embodiments, additional passive devices such as other capacitor implementations and/or resistors and/or inductors may be formed in defective region 434a, or other defective regions of epitaxial silicon body 432.

Thus, the concepts disclosed in the present application enable effective and efficient monolithic integration of a group III-V semiconductor device with a group IV semiconductor device. As a result, low power group IV semiconductor devices may be advantageously utilized as control or logic devices for a composite device including group III-V power semiconductor devices. In addition, electrical isolation of the monolithically integrated group IV semiconductor devices may be enhanced by formation of first and second buried layers having opposing conductivity types, under the group IV semiconductor body in which the group IV semiconductor devices are fabricated. Moreover, the present application enables more efficient use of die surface area by disclosing an approach that utilizes defective regions of the group IV semiconductor body unsuitable for active device fabrication, for population by passive devices such as capacitors, resistors, and inductors.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A monolithic integrated composite device comprising:
 a group IV semiconductor body formed in a trench in a group III-V semiconductor body situated over a group IV semiconductor substrate, said group IV semiconductor body including first and second defective regions adjacent to respective first and second sidewalls of said trench; and
 at least one passive device fabricated in at least one of said first and said second defective regions.

2. The monolithic integrated composite device of claim 1, wherein said at least one passive device fabricated in at least one of said first and second defective regions comprises a capacitor.

3. The monolithic integrated composite device of claim 1, wherein said group IV semiconductor body comprises an epitaxial body grown in said trench.

4. The monolithic integrated composite device of claim 1, wherein said group IV semiconductor body comprises silicon.

5. The monolithic integrated composite device of claim 1, wherein said group III-V semiconductor body comprises a plurality of III-nitride semiconductor layers.

6. The monolithic integrated composite device of claim 1, wherein said group III-V semiconductor body comprises a heterojunction formed at an interface of a gallium nitride (GaN) layer and an aluminum gallium nitride (AlGaN) layer.

7. The monolithic integrated composite device of claim 1, further comprising:
 at least one group IV semiconductor device fabricated in said group IV semiconductor body; and
 at least one group III-V semiconductor device fabricated in said group III-V semiconductor body.

8. A monolithic integrated composite device comprising:
 a group IV semiconductor body formed in a trench in a group III-V semiconductor body situated over a group IV semiconductor substrate, said group IV semiconductor body including a first defective region adjacent to a first sidewall of said trench;
 at least one passive device fabricated in said first defective region.

9. The monolithic integrated composite device of claim 8, wherein said at least one passive device comprises a capacitor.

10. The monolithic integrated composite device of claim 8, wherein said group IV semiconductor body comprises an epitaxial body grown in said trench.

11. The monolithic integrated composite device of claim 8, wherein said group IV semiconductor body comprises silicon.

12. The monolithic integrated composite device of claim 8, wherein said group III-V semiconductor body comprises a plurality of III-nitride semiconductor layers.

13. The monolithic integrated composite device of claim 8, wherein said group III-V semiconductor body comprises a heterojunction formed at an interface of a gallium nitride (GaN) layer and an aluminum gallium nitride (AlGaN) layer.

14. The monolithic integrated composite device of claim 8, further comprising:
 at least one group IV semiconductor device fabricated in said group IV semiconductor body;
 at least one group III-V semiconductor device fabricated in said group III-V semiconductor body.

* * * * *